United States Patent
Schlossberg

[11] 4,006,363
[45] Feb. 1, 1977

[54] GASEOUS INFRARED WAVEGUIDE MIXER

[75] Inventor: Howard R. Schlossberg, Lexington, Mass.

[73] Assignee: The United States of America as represented by the Secretary of the Air Force, Washington, D.C.

[22] Filed: Jan. 26, 1976

[21] Appl. No.: 652,029

[52] U.S. Cl. .......................... 307/88.3; 350/96 WG
[51] Int. Cl.² .......................................... H03F 7/02
[58] Field of Search ............. 307/88.3; 350/96 WG; 321/69 R Primary Examiner—Palmer C. Demeo
Assistant Examiner—Darwin R. Hostetter
Attorney, Agent, or Firm—Joseph E. Rusz; Jacob N. Erlich

[57] ABSTRACT

A gaseous infrared waveguide mixer having a laser beam source in optical alignment with a waveguide, a symmetric top molecular gas having its resonance lines near the wavelength of the laser contained within the waveguide and a DC source electrically connected to the waveguide. Applying the DC field to the gas removes the inversion symmetry of the gas and thereby produces a high output laser beam of preselected frequency or wavelength.

12 Claims, 1 Drawing Figure

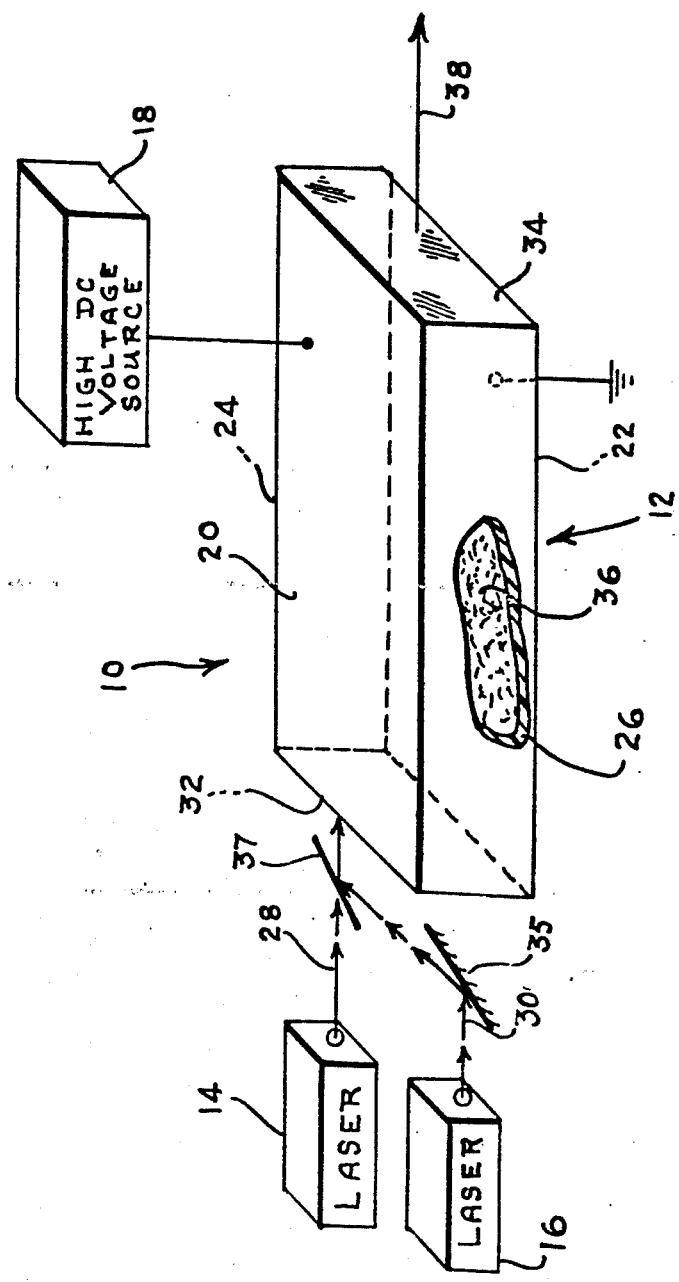

GASEOUS INFRARED WAVEGUIDE MIXER

STATE OF GOVERNMENT INTEREST

The invention described herein may be manufactured and used by or for the Government for governmental purposes without the payment of any royalty thereon.

BACKGROUND OF THE INVENTION

This invention relates generally to lasers, and, more particularly, to a gaseous infrared waveguide mixer capable of producing a powerful laser output at a preselected frequency or wavelength.

Laser separation has for the first time produced macroscopic amounts of isotopically enriched compounds of such elements as boron, chlorine and sulfur. The system which is utilized for producing these compounds is a one laser process. Earlier work in this field utilized two lasers: one emitting in the infrared region to excite selectively one isotopic compound of a mixture and a second laser emitting in the visible or ultraviolet region to dissociate or ionize the excited molecule.

The systems presently in use utilize a powerful infrared laser to dissociate one isotopic compound in conjunction in some instances with a chemical scavenger. The visible or infrared laser excites one isotopic compound while a chemical reaction partner is provided to complete the separation. This one laser process is much more effective than the two laser process of the past.

Unfortunately with the use of certain elements it has been impossible to provide for, in both the one laser and the two laser processes, a laser of sufficient power to complete the desired reaction. It is therefore essential for the completion of these processes to provide a laser beam of predetermined frequency or wavelength which is capable of producing hundreds of watts of average power. Crystals, although successful in producing sum and difference and second harmonic generation at low output cannot successfully meet the power requirements set forth above. Such required power would either damage or destroy the crystals involved.

In addition to the uses set forth above, high output lasers of preselected frequencies find applicability in radar, infrared illuminators, line scan imagers, and infrared gas diagnostics such as in plumes, engine exhaust measurements, atmospheric studies and the like.

SUMMARY OF THE INVENTION

The instant invention sets forth a gaseous infrared waveguide mixer which overcomes the problems set forth hereinabove by producing an extremely powerful laser output at a wavelength or frequency at which no acceptable laser exists today. The mixer of the instant invention utilizes a gas consisting of symmetric top molecules which are subjected to a DC field in an infrared waveguide. One or several infrared laser radiations are sent through the gas thereby generating second harmonic or sum or difference frequencies. In so doing a powerful coherent infrared source in a preselected frequency is now available.

The waveguide utilized with this invention is made up of two highly polished metallic walls, two dielectric walls and infrared windows at each end thereof. Contained within the waveguide is a symmetric top molecular gas such as ammonia at a preselected pressure. A high DC voltage is placed across the metallic walls and under these conditions a strong laser beam output at the difference or sum frequency of the two input lasers will be generated in the gas.

It is therefore an object of this invention to provide a gaseous infrared waveguide mixer which is capable of producing hundreds of watts of average power at a preselected frequency or wavelength.

It is another object of this invention to provide a gaseous infrared waveguide mixer which is economical to produce, highly reliable in operation and which utilizes conventional, currently available components that lend themselves the standard mass producing manufacturing techniques.

For a better understanding of the present invention together with other and further objects thereof, reference is now made to the following description taken in conjunction with the accompanying drawing and its scope will be pointed out in the appended claims.

DESCRIPTION OF THE DRAWING

The only FIGURE of the drawing is a pictorial, schematic representation of the gaseous infrared waveguide mixer of this invention.

DETAILED DESCRIPTION OF THE PREFERRED EMBODIMENT

Reference is now made to the only FIGURE of the drawing which shows in pictorial, schematic fashion the gaseous infrared waveguide mixer 10 of this invention.

Mixer 10 is made up of a specially designed waveguide 12 in optical alignment with at least one laser source, or as a preferred, and as shown in the drawing a pair of laser sources 14 and 16. A high voltage DC source 18 is also electrically connected to waveguide 12.

The waveguide 12 is of a rectangular-shaped configuration having a pair of highly polished metallic walls 20 and 22 of any suitable material such as aluminum spaced apart in the area of $200\mu m - 500\mu m$. It is essential that these walls 20 and 22 be parallel and highly polished. The side walls 24 and 26 of waveguide 12 are constructed of any suitable dielectric material such as beryllium oxide. At opposite ends of waveguide 12 and in optical alignment with the output beam 28 and 30 of lasers 14 and 16, respectively, are a pair of infrared windows 32 and 34 made of any suitable material such as sodium chloride.

Located within waveguide 12 is a symmetric top molecular gas 36 which must have resonance lines close to the input wavelength of lasers 14 and 16. A symmetric top molecular gas being one consisting of molecules which have two of its moments of inertia equal. For example, utilizing a CO laser 14 having a wavelength $\lambda_1 = 6$ microns, and $CO_2$ laser 16 having a wavelength $\lambda_2 = 10$ microns, the gas 36 within waveguide 12 could be ammonia ($NH_3$) at a pressure of approximately 5 torr. Beams 28 and 30 from the CO and $CO_2$ lasers 14 and 16, respectively, closely tuned near a resonance line within the $\nu_4$ and $\nu_2$ modes, respectively, are combined by means of a totally reflective mirror 35 and a dichroic mirror 37 before passing through gas 36. Any suitable DC voltage source 18 is electrically connected to metallic walls 20 and 22. This source 18 should be a DC supply of about 500–1000 volts.

Upon the passing of combined laser beams 28 and 30 through gas 36 an extremely powerful laser beam output 38 is produced, this output 38 is generated within the gas 36 at the second harmonic frequency is only one laser is used or at the sum or difference frequency with two laser inputs as shown. In the instant invention the combination of the DC field and symmetric top molecular gas removes the inversion symmetry of the gas and as a result thereof a parametric or sum and difference frequency generation of the pair of input beams 28 and 30 takes place within gas 36. The parametric interraction is usefully large because the input frequencies of lasers 14 and 16 are near the molecular resonance or resonance lines of gas 36 within waveguide 12.

For example, in general in the instant invention:

$$\text{frequency} = (c/\lambda_1) \pm (c/\lambda_2) = c/\lambda_{out}).$$

with the CO and $CO_2$ lasers 14 and 16, respectively, as set forth hereinabove, $$f = (c/6) \pm (c/10) = c/16$$

The instant invention is therefore successful in producing a laser output 38 of extremely high power, this power being in the range of 1000's of watts of power, and at a wavelength or frequency wherein heretofore no acceptable laser existed. There is virtually no limitation as to the length of waveguide 12, with a longer waveguide producing a more efficient output 38.

Although this invention has been described with reference to a particular embodiment, it will be understood to those skilled in the art that the invention is capable of a variety of alternate embodiments within the spirit and scope of the appended claims.

I claim:

1. An infrared gaseous waveguide mixer comprising a laser source capable of producing a laser beam, a waveguide, said waveguide being of rectangular configuration having a pair of opposed metallic walls, a pair of opposed dielectric walls and an infrared window at each end thereof, said waveguide being in optical alignment with said laser beam, a DC source electrically connected to said metallic walls and a gas contained within said waveguide whereby said waveguide mixer produces an output of extremely high power.

2. In infrared gaseous waveguide mixer as defined in claim 1 wherein said gas is a symmetric top molecular gas having its resonance lines close to the input wavelength of said laser source.

3. An infrared gaseos waveguide mixer as defined in claim 2 wherein said metallic walls are highly polished and in parallel relationship to each other.

4. An infrared gaseous waveguide mixer as defined in claim 3 wherein said metallic walls are spaced approximately $200\mu m - 500\mu m$ apart.

5. An infrared gaseous waveguide mixer as defined in claim 4 wherein said DC source supplies approximately 500–1000 volts.

6. An infrared gaseous waveguide mixer as defined in claim 5 wherein said gas is at a pressure of approximately 5 torr.

7. An infrared gaseous waveguide mixer as defined in claim 2 further comprising at least one other laser source for producing a laser beam, said laser source having its wavelength close to the resonance lines of said gas.

8. An infrared gaseous waveguide mixer as defined in claim 7 further comprising means located between said laser sources and said waveguide for combining said laser beams emanating therefrom.

9. An infrared gaseous waveguide mixer as defined in claim 8 wherein said metallic walls are highly polished and in parallel relationship to each other.

10. An infrared gaseous waveguide mixer as defined in claim 9 wherein said metallic walls are spaced approximately $200\mu m - 500\mu m$ apart.

11. An infrared gaseous waveguide mixer as defined in claim 10 where said DC source supplies approximately 500–1000 volts.

12. An infrared gaseous waveguide mixer as defined in claim 11 wherein said gas is at a pressure of approximately 5 torr.

* * * * *

UNITED STATES PATENT OFFICE
CERTIFICATE OF CORRECTION

PATENT NO. : 4,006,363
DATED : February 1, 1977
INVENTOR(S) : HOWARD R. SCHLOSSBERG It is certified that error appears in the above-identified patent and that said Letters Patent are hereby corrected as shown below:

Column 2, line 68 "is" should read ---if---

Claim 3, line 1 "gaseos" should read ---gaseous---

Signed and Sealed this

Twenty-fourth Day of May 1977

[SEAL]

Attest:

RUTH C. MASON
Attesting Officer

C. MARSHALL DANN
Commissioner of Patents and Trademarks